US009712163B2

(12) United States Patent
Intini

(10) Patent No.: US 9,712,163 B2
(45) Date of Patent: Jul. 18, 2017

(54) MANUALLY OPERATED SWITCHING DEVICE FOR A VEHICLE WITH A SENSOR ACTIVATION DEVICE

(71) Applicant: VALEO Schalter und Sensoren GmbH, Bietigheim-Bissingen (DE)

(72) Inventor: Onofrio Intini, Vaihingen/Enz (DE)

(73) Assignee: VALEO Schalter und Sensoren GmbH, Bietigheim-Bissingen (DE)

(*) Notice: Subject to any disclaimer, the term of this patent is extended or adjusted under 35 U.S.C. 154(b) by 69 days.

(21) Appl. No.: 14/404,956

(22) PCT Filed: Jun. 12, 2013

(86) PCT No.: PCT/EP2013/062153
§ 371 (c)(1),
(2) Date: Dec. 2, 2014

(87) PCT Pub. No.: WO2013/186259
PCT Pub. Date: Dec. 19, 2013

(65) Prior Publication Data
US 2015/0171862 A1    Jun. 18, 2015

(30) Foreign Application Priority Data
Jun. 13, 2012 (DE) .................. 10 2012 011 875

(51) Int. Cl.
*H03K 17/975* (2006.01)
*H03K 17/96* (2006.01)
(Continued)

(52) U.S. Cl.
CPC ....... *H03K 17/9622* (2013.01); *B60Q 1/1476* (2013.01); *B60Q 9/00* (2013.01);
(Continued)

(58) Field of Classification Search
CPC .. B60K 37/06; B60K 20/02; H01H 2231/026; H01H 3/00; H01H 3/02; H01H 3/12;
(Continued)

(56) References Cited

U.S. PATENT DOCUMENTS 1,716,204 A * 6/1929 Denley .................. B60Q 1/343
200/61.27
4,131,772 A * 12/1978 Weckenmann ....... B60S 1/0807
200/600
(Continued)

FOREIGN PATENT DOCUMENTS

DE    199 06 535 A1    8/2000
DE    100 54 862 A1    6/2002
(Continued)

OTHER PUBLICATIONS

International Search Report for corresponding International Application No. PCT/EP2013/062153, mailed Nov. 26, 2013 (5 pages).
(Continued)

*Primary Examiner* — Anthony R. Jimenez
(74) *Attorney, Agent, or Firm* — Osha Liang LLP

(57) ABSTRACT

A manually operated switching device for a vehicle, with a switch lever and at least one touch-sensitive sensor device formed on the switch lever, which is designed for detecting an effect on a sensor surface of the sensor device that leaves the switch lever positionally unchanged and that triggers a switching signal, wherein an activation device is formed, with which the detecting state of the sensor device is activated as defined by the user.

9 Claims, 1 Drawing Sheet

(51) Int. Cl.
*B60Q 1/14* (2006.01)
*B60Q 9/00* (2006.01)
*H01H 13/83* (2006.01)

(52) U.S. Cl.
CPC ....... *H01H 13/83* (2013.01); *H01H 2219/036* (2013.01); *H03K 2217/96042* (2013.01)

(58) Field of Classification Search
CPC .. H01H 9/20; H01H 2003/00; H01H 2003/02; H01H 2003/08; H01H 2217/00; H01H 2217/002; H01H 2217/004; H01H 2217/024; H01H 2221/00; H01H 2221/002; H01H 2221/012; H01H 2221/022; H01H 2221/068; H01H 2221/08; H01H 2221/809; H01H 2231/032; H01H 2239/05; H01H 2239/074; H01H 2300/02; H01H 2300/022; H01H 2300/024; H01H 2009/066; H03K 17/975; F16H 59/08; G06F 3/048; B60S 1/583; B60Q 1/1469
USPC ....... 200/600, 176, 181, 43.01, 43.11, 43.16, 200/43.17, 43.21, 61.28, 61.54, 61.45 M, 200/61.85, 61.88, 61.87, 518, 557, 293, 200/293.1, 318.2, 332, 332.2, 335; 345/173, 174
See application file for complete search history.

(56) References Cited

U.S. PATENT DOCUMENTS

| 2003/0034954 | A1* | 2/2003 | Sakamaki | B60K 37/06 345/156 |
|---|---|---|---|---|
| 2009/0120233 | A1* | 5/2009 | Hornung | B60K 37/06 74/523 |
| 2009/0140993 | A1* | 6/2009 | Han | G06F 3/016 345/173 |
| 2010/0073152 | A1* | 3/2010 | Nagamine | B60W 50/08 340/425.5 |
| 2011/0167947 | A1* | 7/2011 | Hisatsugu | G06F 3/0202 74/491 |
| 2012/0200475 | A1* | 8/2012 | Baker | G09F 13/04 345/4 |
| 2014/0375584 | A1* | 12/2014 | Kaiser | B60Q 1/1476 345/173 |

FOREIGN PATENT DOCUMENTS

| DE | 102 12 764 A1 | 10/2003 |
|---|---|---|
| DE | 10 2005 021 681 A1 | 6/2006 |
| DE | 10 2007 024 140 A1 | 11/2008 |
| DE | 10 2009 022 471 A1 | 12/2010 |
| DE | 10 2010 047 160 A1 | 4/2012 |
| FR | 2 346 180 A1 | 10/1977 |
| FR | 2 880 145 A1 | 6/2006 |
| JP | 2001-155590 A | 6/2001 |
| JP | 2012-035669 A | 2/2012 |
| JP | 05-088888 B2 | 12/2012 |
| WO | 2008/131190 A1 | 10/2008 |
| WO | 2010/103221 A1 | 9/2010 |

OTHER PUBLICATIONS

Search Report for corresponding German Application No. 10 2012 011 709.4, mailed Sep. 17, 2012 (5 pages).

Office Action in corresponding Japanese application No. 2015-516602, dated Nov. 27, 2015 (7 pages).

* cited by examiner

MANUALLY OPERATED SWITCHING DEVICE FOR A VEHICLE WITH A SENSOR ACTIVATION DEVICE

BACKGROUND

The invention relates to a manually operated switching device for a vehicle with a switch lever and at least one touch-sensitive sensor device formed on the switch lever, which is designed for detecting an effect on a sensor surface of the sensor device that leaves the switch lever's position unchanged and that triggers a switching signal.

Such a switching device is known from DE 10 2009 022 471 A1. Therein capacitive sensors for detecting switching processes without displacement are formed on a steering column switch.

SUMMARY

It is the object of the present invention to develop a manually operated switching device for a vehicle such that unwanted operations can be prevented.

This object is achieved by a switching device according to the independent claim.

A manually operated switching device according to the invention for a vehicle comprises a switch lever. Moreover, the switching device comprises a touch-sensitive sensor device that is formed on the switch lever. The sensor device is designed for detecting an effect on a sensor surface of the sensor device that leaves the switch lever positionally unchanged and that triggers a switching signal. It is thus provided that a switching signal is only triggered by a corresponding effect, e.g. a direct contact or the penetration into a detection region of the sensor surface by an object, e.g. by a finger or a hand of a user, without the switch lever having to be varied in its position for this purpose.

A fundamental concept of the invention is that the switching device comprises an activation device, with which the detecting state of the sensor device can be activated as defined by the user. Unwanted switching signal triggering and thus also incorrect operations can be prevented by such an embodiment of the switching device. The sensor surface is thus not permanently in the sensing and thus also detecting state, but must first be suitably activated in order to take up said detecting state. According to the invention, this is carried out by the user himself, so that here too a very deliberate and for the user intuitively verifiable procedure is necessary. A high level of reliability of operation of the switching device is also enabled in this way.

It is preferably provided that the activation device comprises an operating element that is formed on the switch lever. A procedure is enabled by such an embodiment that is very compact in terms of installation space and that is very easily traceable in respect of the activation scenario for a user and that is able to be carried out intuitively.

It is preferably provided that the operating element is formed outside a region of an end piece of the switch lever that is provided for gripping by a user in the case of a position-changing operation of the switch lever. Said implementation is particularly noteworthy because the operating element is thus formed at a specific position that is normally not directly touched or contacted when gripping the switch lever for operation in the context of an action that changes the position of the switch lever, so that also in this connection the detecting state of the sensor surface is not undesirably activated automatically in the case of such a specific effect on the switch lever.

It is preferably provided that the operating element and the sensor surface are disposed at opposite edges of the switch lever. The above-mentioned advantages are thereby reaffirmed.

It is preferably provided that the operating element is formed on a lower edge of the switch lever. The operation of the operating element is thereby facilitated for a user.

The operating element can be a manually operated pushbutton switch or toggle switch as an exemplary implementation. It can also be provided that the operating element is a touch-sensitive sensor.

It is preferably provided that in the activated state of the sensor device, and thus in the detecting state, the sensor surface is illuminated at least in some areas. Said activated state can thus be displayed to a user so as to very easily perceptible. Also at night and in the case of an unilluminated or darkened passenger compartment, the visibility of the activated state can thus be very easily recognized.

It is preferably provided that the sensor surface is illuminated in a first light colour in the activated state of the sensor device and is illuminated in a second light colour in the deactivated state of the sensor device. The visibility and detectability of the respective states are thereby further improved.

It is also advantageous if the operating element is illuminated. In this way the spatial position can be very easily perceived even in dark lighting conditions and the operation of the operating element by a user can take place very purposefully and safely.

It is preferably provided that with the operation of the activation device and the resulting generation of the detecting state, the sensor surface retains said activated state for a specified period of time and then in turn an automatic deactivation takes place. This is especially advantageous if in said period of time there is no contact on the sensor surface or no effect on the sensor surface such that a switching signal would be triggered.

The same can also be provided if no further effect takes place on the sensor surface for a defined specified period of time following a switching signal triggering effect on the sensor surface, so that here too the non-detecting state of the sensor surface is set again, especially automatically.

It can, however, also be provided that the changeover of the sensor device from the active state to the inactive state likewise takes place as determined by the user, especially by a further corresponding operation of the operating element.

In another advantageous implementation, it is provided that the switching device comprises a vibration device, with which, in the event of an effect on the sensor surface of the sensor device when in the activated state that triggers a switching signal, a vibration signal that acts on the switch lever can be produced as haptic feedback to the user. This is particularly advantageous because the user then also receives feedback without delay as to whether his action on the sensor surface has resulted in the desired triggering of a switching signal and the associated initiation of an operating function of a functional unit of the vehicle. A vibration device is particularly advantageous in this context, because it provides the user with definite and easily perceived corresponding feedback and on the other hand in this respect no undesirable and potentially disruptive or non-uniquely attributable acoustic signals or optical signals are produced. In this regard, feedback is given to the user by a vibration signal exactly at the point, i.e. on the switch lever, at which the operation by the user is also carried out. This is currently particularly advantageous in modern vehicle technology because a number of possibly audible and visual feedback signals are already provided for other functions and devices, and in this respect a particularly easily perceived and attributable feedback function that is definitely defined for this purpose is provided by the vibration signal.

It is preferably provided that the vibration device comprises a vibration motor, which is disposed in the switch lever. Said embodiment enables the switch lever to also act as a holder or support for the vibration motor and is especially made hollow at least in some regions. The switch lever can also be made extremely compact in this context. In particular, however, the very direct transfer of the vibration signal to some areas of the switch lever can take place, so that here too reliable feedback is given to the user without delay.

It is preferably provided that the vibration motor is contacted by spring arms or a cable on a control unit on a circuit board, wherein in particular the circuit board is disposed in the switch lever.

In particular, it can also be provided that the vibration motor is soldered onto a flexible circuit board, which comprises at least one capacitive sensor of the sensor device.

It is preferably provided that the switching device is a steering column switch. Currently, such steering column switches are combined in modern vehicle technology with a number of operating functions, which can be triggered depending on a position-changing operation and/or on a non-position-changing operation. Currently, in the case of steering column switches it is therefore particularly advantageous that suitable specific sensors only detect when they are activated, so that here it is currently particularly true in the case of said implementations that unwanted incorrect operations can be prevented. Nevertheless, the high functionality with the triggering of multiple operating functions is maintained.

Further features of the invention are apparent from the claims, the figures and the description of the figures. The features and combinations of features mentioned above in the description and the features and combinations of features mentioned below in the description of the figures and/or shown in the figures alone are not only able to be used in the respective stated combination, but can also be used in other combinations or on their own, without departing from the scope of the invention. Thus there are also implementations of the invention that are to be viewed as included and disclosed that are not explicitly shown and explained in the figures, but that arise from and are produced by combinations of features that are separate from the explained implementations.

BRIEF DESCRIPTION OF DRAWINGS

Exemplary embodiments of the invention are explained in detail using schematic figures. In the figures.

In the figures, identical or functionally equivalent elements are provided with the same reference characters.

DETAILED DESCRIPTION

Figure 1:
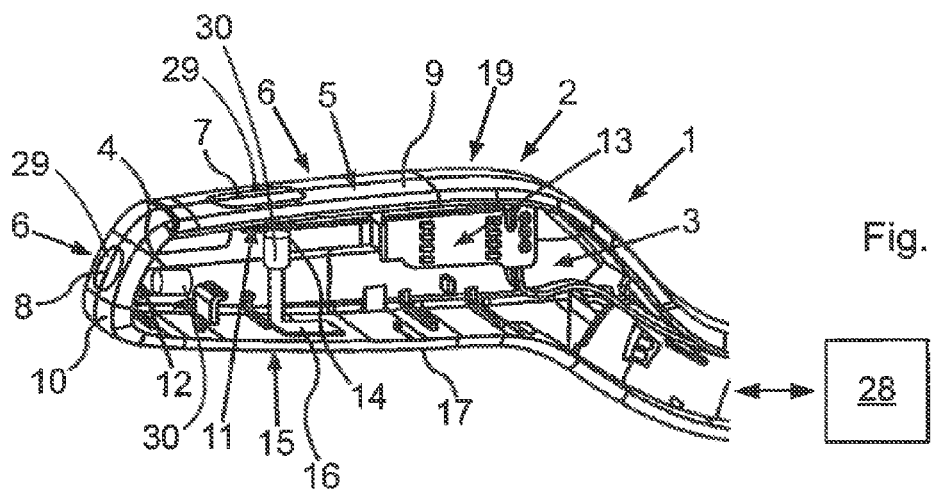
FIG. 1 shows a perspective representation of sub components of an exemplary embodiment of a switching device according to the invention.

In FIG. 1 a manually operated switching device 1 is provided, which can be disposed in a vehicle and which is in the form of a steering column switch 1. The steering column switch 1 can e.g. be disposed in the region of a steering wheel and comprises a switch lever 2. The switch lever 2 is designed to be elongated and curved in the exemplary embodiment and is hollow. A plurality of components are disposed in a cavity 3 bounded by a rear wall 4, a front wall that is not shown in FIG. 1 and thereby allows a view into the cavity 3, and a circumferential edge 5 that connects the front wall and the rear wall 4.

Moreover, a touch-sensitive sensor device 6 is formed on the switch lever 2. The sensor device 6 is designed for detecting an effect on a sensor surface of the sensor device 6 that leaves the switch lever 2 positionally unchanged and that triggers a switching signal. In the exemplary embodiment, two sensor surfaces 7 and 8 are formed. These are configured on different edge regions of the edge 5, wherein for this purpose the sensor surface 7 is formed on an upper edge region 9 and the sensor surface 8 is formed on a lateral edge region 10.

In particular, the sensor device 6 comprises capacitive sensors 11 and 12 coupled to the sensor surfaces 7 and 8.

It is preferably provided that the capacitive sensors 11 and 12 are formed by a conducting copper surface on a flexible film. In particular, it is provided that said flexible film is connected to a control unit 13 and constitutes a direct interaction with an activating element, which e.g. can be a finger of a user. The sensor surfaces 7 and 8 can be connected to the outer casing and thus to the edge 5 of the switch lever 2, so that the lever is directly underneath the touch-sensitive surface.

It is advantageous here that no air gap is formed between the sensor 11 or 12 of such a form and the outer casing and therefore the edge 5. For this purpose it is especially provided that the capacitive sensors 11 and 12 are each applied to a film 26 and said film is joined to the outer casing and thus to the edge 5, e.g. using an adhesive 27, or is suitably encapsulated, resulting in integration of the film within the synthetic material of the edge 5.

The capacitive sensors 11 and 12 are preferably connected to a flexible circuit board 14 as a flexible film, which in turn is directly connected to the control unit 13. The control unit 13 is applied to as circuit board in this case, which can likewise be flexible or can be in the form of a rigid board 33.

It is preferably provided that the control unit 13 or the corresponding circuit is disposed in the immediate vicinity of the sensors 11 and 12 and is thus positioned close to the sensors 11 and 12 in the cavity 3. By such a directly adjacent positioning between the control unit 13 and the sensors 11 and 12, the self-capacitance of the sensors 11 and 12 can be kept very small in relation to the mass, because otherwise longer conducting tracks also interact with the surroundings and increase the capacitance. High functional dependability and reliability can thus also be achieved by a very compact and close arrangement with respect to each other.

In the exemplary embodiment it is provided that operating functions of functional units 28 of the vehicle can be triggered by touching a sensor surface 7 or 8, or a switching signal can be triggered by fingers or similar merely entering as working range of the sensor surface 7, 8 without contact. Said operations thus take place such that no positional change of the switch lever 2 is carried out. In addition, for this purpose it can be provided that the switch lever 2 position can also be changed in order to be able to trigger suitable switching signals for operating functions of functional units.

With regard to such functional units, e.g. a light unit, a windscreen wiper device, a windscreen washer system, a flasher, a navigation system, an audio system or an infotainment system can be examples and can be provided.

An effect on the sensor surface 7 or 8 is thus possible by means of a direct contact and also by means of non-contact and penetration into a detection region.

In order to be able to prevent unwanted erroneous settings and operations just of the capacitive sensors 11 and 12, and thus an unwanted erroneous operation in the case of an effect on the sensor surface 7 and 8 that does not change the position of the switch lever 2, the switching device and thus the steering column switch 1 comprises an activation device 15. The activation device 15 is formed on the switch lever 2 separately from and at a distance from the capacitive sensors 11 and 12, and thus also from the sensor surfaces 7 and 8. The activation device 15 comprises an operating element 16, which is externally accessible and can be operated by means of a lower edge region 17 of the edge 5. The operating element 16 can be a manually operated press-button switch or a toggle switch or similar. The operating element 16 can, however, also be a touch-sensitive operating surface.

The capacitive sensors 11 and 12 are deactivated in their basic state according to an exemplary embodiment, and therefore detection cannot occur. This means that even if an effect on the sensor surfaces 7 and 8 occurs, no detection takes place and thus also no associated switching signal is triggered, so that in addition the operating function associated with the switching signal is not initiated or triggered.

By means of an operation of the operating element 17, the capacitive sensors 11 and 12 and thus also the entire sensor device are transitioned from a deactivated state into an activated state and the sensor device is thus transferred into the detecting state. Only then can an effect on the sensor surfaces 7 and 8 be recognized and recorded and the corresponding switching signal can be triggered. The operating element 16 is also electrically connected to the flexible circuit board 14 and by means of the same to the control unit 13.

With the activation device 15, the detecting state of the sensor device 6 is activated as defined by the user.

It can be provided that the activated state of the sensor device 6 is also deactivated again as defined by the user, especially by the operation of the operating element 16. It can, however, also be provided that the deactivated state is automatically set again after a predetermined period of time following the setting of the activated state.

In particular, it is also provided that the sensor surfaces 7 and 8 are illuminated at least in some regions 31. For example, light emitting diodes 30 can be provided here, which are disposed in the cavity 3. It can preferably be provided for this that the sensor surfaces 7 and 8 are illuminated in a first light colour in an activated state of the sensor device 6, and are illuminated in a second light colour in the deactivated state of the sensor device 6.

It is preferably also provided that the operating element 16 is illuminated at least in some regions.

By means of the activation device 15 it is ensured that no lever function is unintentionally activated by contact with the sensitive surfaces or the sensor surfaces 7 and 8 during the operation of a basic switch function, which can be e.g. indicator flashing, headlight flashing, main beam or windscreen washing.

Figure 2:
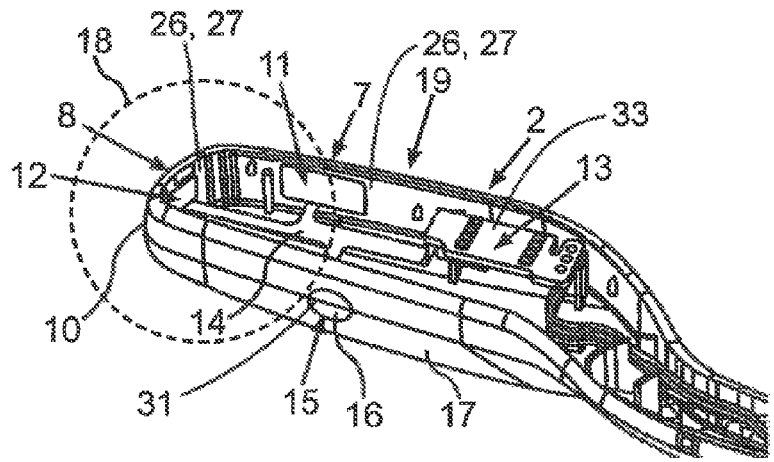
FIG. 2 shows a further perspective representation of the embodiment according to FIG. 1.

According to the representation in FIG. 1 and FIG. 2, it can also be recognized that the operating element 16 is formed outside of a region 18 of an end piece 19 of the switch lever 2 that is provided for gripping by a user. Said region 18 is especially necessary and provided if the switch lever 2 position has to be changed for triggering a switch signal for a specific operating function and therefore has to be suitably gripped by a user. For such specific positioning of the operating element 16, unintentional operation of the operating element 16 can be prevented during gripping of said region 18 by a user.

With regard to the visualisation of the activated sensor surfaces 7 and 8, e.g. a change of light colour from red to green can take place and the green light colour illuminates if the activated state of the sensor device 6 occurs. However, illuminated symbols 29 can also be provided, which also signal the ready state to the driver of the vehicle by means of a change of light colour and hence indicate the activated state.

Figure 3:
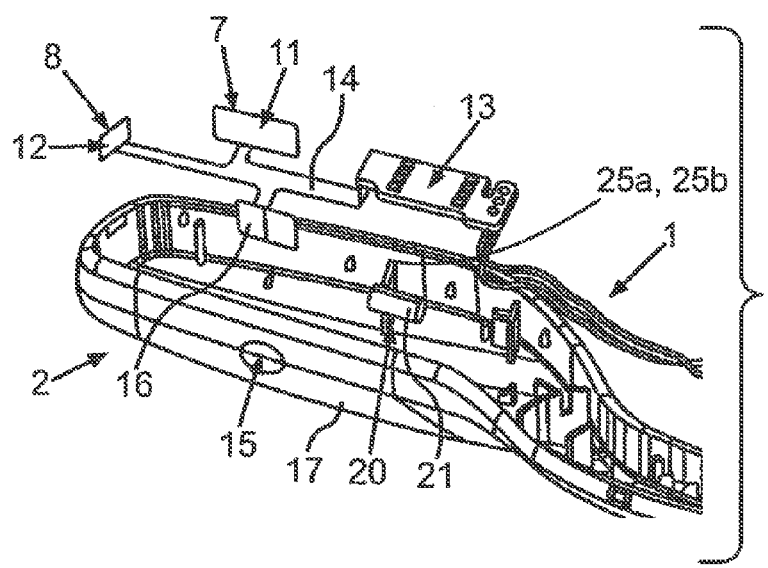
FIG. 3 shows a partial exploded representation of the switching device according to FIG. 1 and FIG. 2.

It is also particularly advantageous that the embodiment of the steering column switch 1 comprises a vibration device 20 (FIG. 3), which is likewise disposed in the cavity 3. In FIG. 3 a partially exploded representation of the steering column switch 1 is shown for this. It can be recognized thereby that a vibration motor 21 of the vibration device 20 is disposed beneath the circuit board of the control unit 13. It is thus disposed directly adjacent to said circuit board and accordingly can be connected to the same. By means of the vibration device 20, the user is given haptic feedback in the form of a vibration signal in order to be able to confirm the operation and the effect on the sensor surfaces 7 and 8. The vibration signal is thereby transferred to the switch lever 2 by means of the vibration motor 21, so that direct and definite feedback is given to a user.

It can be provided that the vibration motor 21 is contacted by spring arms 25*a* or a cable 25*b* on the control unit 13 on the circuit board. It can also be provided that the vibration motor 21 is soldered onto a flexible circuit board, especially the circuit board 14. In particular, the vibration motor 21 can also be soldered by means of the cable to the circuit board of the control unit 13.

The invention claimed is:

1. A manually operated switching device for a vehicle, comprising:
    a switch lever; and
    a touch-sensitive sensor device formed on the switch lever, wherein the touch-sensitive sensor device is for detecting an effect on a sensor surface of the sensor device that leaves the switch lever positionally unchanged and that triggers a switching signal,
    further comprising an activation device, with which a detecting state of the sensor device is activated as defined by a user,
        wherein the activation device comprises an operating element farmed on the switch lever,
        wherein the operating element is formed outside a region of an end piece of the switch lever that is provided for gripping by the user operating the switch lever, and
    wherein the switching device is a steering column switch, formed from an elongated, curved and hollow body.

2. The switching device according to claim 1, wherein the operating element and the sensor surface are disposed on opposite edge regions of an edge of the switch lever.

3. The switching device according to claim 2, wherein the operating element is formed on a lower edge region of the switch lever.

4. The switching device according to claim 1, wherein the sensor surface is illuminated at least in some regions in an activated state of the sensor device.

5. The switching device according to claim 4, wherein the sensor surface is illuminated in a first light color in the activated state of the sensor device and is illuminated in a second light color in a deactivated state of the sensor device.

6. The switching device according to claim 1, further including a vibration device, with which a vibration signal is generated as haptic feedback to the user in case of an effect on the sensor surface of the sensor device in an activated state that triggers a switching signal.

7. The switching device according to claim 6, wherein the vibration device comprises a vibration motor disposed in the switch lever.

8. The switching device according to claim 7, wherein the vibration motor is contacted by spring arms or a cable on a control unit on a circuit board.

9. The switching device according to claim 7, wherein the vibration motor is soldered to a flexible circuit board, which comprises at least one capacitive sensor of the sensor device.

\* \* \* \* \*